(12) United States Patent
Inao et al.

(10) Patent No.: US 7,871,744 B2
(45) Date of Patent: Jan. 18, 2011

(54) NEAR-FIELD EXPOSURE APPARATUS AND NEAR-FIELD EXPOSURE METHOD

(75) Inventors: Yasuhisa Inao, Tokyo (JP); Toshiki Ito, Kawasaki (JP); Natsuhiko Mizutani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 34 days.

(21) Appl. No.: 11/914,040

(22) PCT Filed: Oct. 10, 2007

(86) PCT No.: PCT/JP2007/070220

§ 371 (c)(1),
(2), (4) Date: Nov. 9, 2007

(87) PCT Pub. No.: WO2008/047818

PCT Pub. Date: Apr. 24, 2008

(65) Prior Publication Data

US 2009/0311631 A1   Dec. 17, 2009

(30) Foreign Application Priority Data

Oct. 10, 2006   (JP)   ............................... 2006-276093

(51) Int. Cl.
*G03F 9/00* (2006.01)
*G21K 5/00* (2006.01)
*H05G 1/00* (2006.01)
(52) U.S. Cl. .................... 430/22; 430/327; 430/966; 355/53; 355/67; 378/34; 378/210
(58) Field of Classification Search ............... 430/22, 430/327, 966; 355/53, 67; 378/34, 210
See application file for complete search history.

(56) References Cited

U.S. PATENT DOCUMENTS 6,090,176 A * 7/2000 Yoshitake et al. .......... 55/385.4

6,171,730 B1   1/2001 Kuroda et al.

FOREIGN PATENT DOCUMENTS

| JP | 2000-321777 | 11/2000 |
|---|---|---|
| JP | 2005-101133 | 4/2005 |

OTHER PUBLICATIONS

International Search Report dated Feb. 5, 2008, which was mailed in a Communication dated Feb. 21, 2008, in corresponding International Application No. PCT/JP2007/070220.
Written Opinion of the International Searching Authority mailed Feb. 21, 2008, issued in International Application No. PCT/JP2007/070220.
McNab, S., et al. "Effects of mask materials on near field optical nanolithography," Materials Research Society Symposium Proceedings, Materials Research Society, Pittsburgh, PA, vol. 705, Nov. 25, 2001, pp. 107-112.
Extended Abstracts (The 53$^{rd}$ Spring Meeting, 2006); The Japan Society of Applied Physics and Related Societies, No. 2, Mar. 22, 2006, p. 757, with translation.

\* cited by examiner

*Primary Examiner*—Christopher G Young
(74) *Attorney, Agent, or Firm*—Fitzpatrick, Cella, Harper & Scinto (57) ABSTRACT

A near-field exposure apparatus includes a near-field exposure mask and a mechanism places a substrate, to be exposed, opposed to the near-field exposure mask. A mechanism performs relative alignment of the near-field exposure mask and the substrate to be exposed. A mechanism closely contacts the near-field exposure mask and the substrate to be exposed, with each other. A mechanism projects exposure light to the near-field exposure mask, and a soft X-ray irradiating device removes static electricity charged in at least one of the near-field exposure mask and the substrate to be exposed. The soft X-ray irradiating device is disposed such that the near-field exposure mask is located between the soft X-ray irradiating device and the substrate to be exposed.

10 Claims, 5 Drawing Sheets

NEAR-FIELD EXPOSURE APPARATUS AND NEAR-FIELD EXPOSURE METHOD

This application claims priority from International Patent Application No. PCT/JP2007/070220, filed Oct. 10, 2007, which claims priority from Japanese Patent Application Laid-Open No. 2006-276093, filed Oct. 10, 2006, both of which are hereby incorporated by reference herein in their entirety.

TECHNICAL FIELD

The present invention relates to a near-field exposure apparatus and a near-field exposure method.

BACKGROUND ART

In recent years, lithographic techniques have evolved and have been diversified more and more, and various exposure methods have been proposed as emerging lithographic techniques attempting new possibilities.

Among them, U.S. Pat. No. 6,171,730 discusses an example that proposes a near-field exposure method for performing near-field exposure based on a contact method, in comparison with conventional projection exposure methods.

As the light blocking material of a mask to be used in such a contact near-field exposure method, use of silicon has been suggested (The 53rd Japanese Applied Physics Alliance Lecture Proceedings, 25a-ZB-1, 2006, Spring).

On the other hand, Japanese Laid-Open Patent Application No. 2005-101133 proposes that, after a mask and a wafer are closely contacted and they are exposed, if there is an attraction force based on static electricity working therebetween to attract them, an outside mechanism that neutralizes the electrification is used to weaken the electrostatic attraction force in order to facilitate separation of the mask and the wafer.

Furthermore, Japanese Laid-Open Patent Application No. 2000-321777 proposes an exposure apparatus wherein static electricity produced is removed by projecting soft X-rays to a photomask, in a direction along the mask surface, thereby to prevent adhesion of dust or foreign particles on the photomask or the wafer.

The near-field exposure process can provide a resolving power that enables patterning of a half pitch size of 45 nm or less. In order to meet this, very high precision is required for the alignment between the exposure mask and the substrate.

The near-field exposure method proposed by U.S. Pat. No. 6,171,730 is a method in which close contact, exposure and separation of an exposure mask and a substrate coated with a resist are carried out repeatedly. Therefore, if a material having a low electrical conductivity is used as the light blocking material, static electricity will be produced easily.

On the other hand, the near-field exposure method described in the 53rd Japanese Applied Physics Alliance Lecture Proceedings, 25a-ZB-1, 2006, Spring, uses amorphous silicon having a low electrical conductivity as a light blocking material, which can be easily electrically charged, as compared with metal light blocking films conventionally being used.

Additionally, electrification may be caused by vibration of the machine during mask conveyance or mask loading/unloading.

Due to the static electricity produced between the exposure mask and the substrate being charged, as described above, an attraction force or a repulsive force is produced, and applied between them.

In the exposure method based on near-field light, the near-field light exists only in a limited region of about 100 nm or less, which is extraordinarily close to the exposure mask surface. Therefore, it is necessary to perform the exposure while keeping the exposure mask and the resist-coated substrate surface in close contact with each other.

Thus, if the alignment operation for the exposure mask and the resist-coated substrate surface is carried out after they are brought into close contact with each other, it means that the relative position of the mask and the substrate is changed, while they are kept in close contact with each other. This causes several problems, such as resist exfoliation or mask breakage, for example.

In order to avoid this, for alignment of an exposure mask and a resist-coated substrate, the alignment operation for them should be carried out before they are brought into close contact with each other.

However, if the exposure mask is made of an elastic material, which is very thin in thickness, as described in U.S. Pat. No. 6,171,730, or of a material which itself is soft, like a resin, there is a possibility that the exposure mask is deformed by the electrostatic force.

Figure 2A:
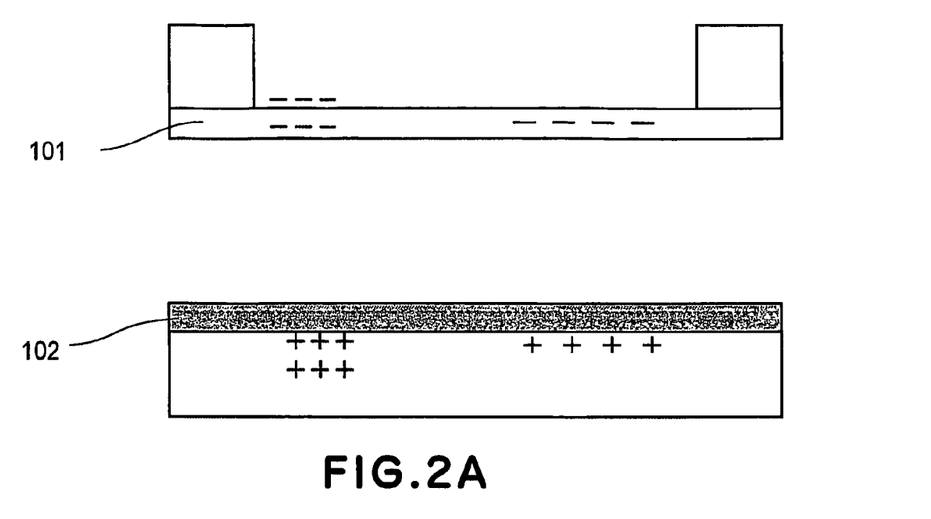
FIG. 2A and FIG. 2B are schematic diagrams for explaining distortion of an exposure mask in a conventional example, when the exposure mask and a resist-coated substrate are being electrically charged.
Figure 2B:
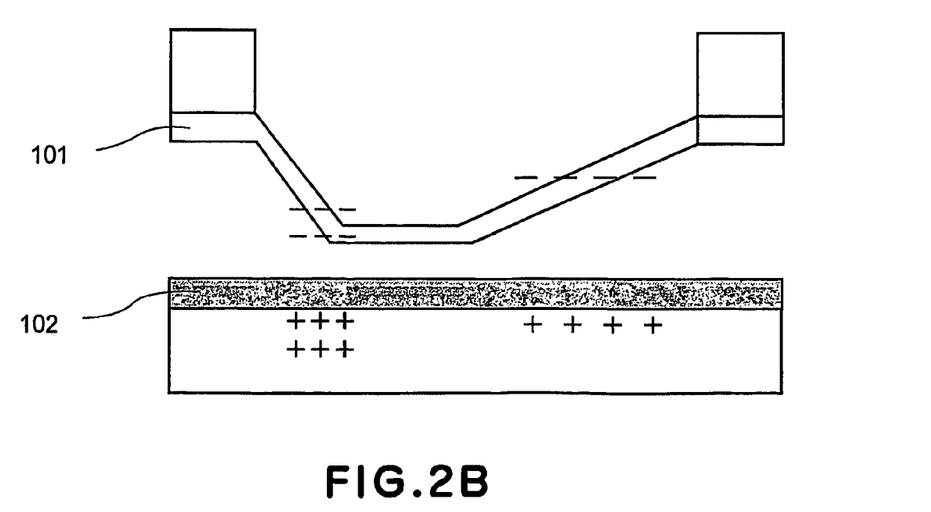

For example, if, as shown in FIG. 2A, an exposure mask 101 and a resist-coated substrate 102 are locally charged, the portions of the mask and the substrate, where a stronger attraction force is applied, may be strongly attracted to each other, as shown in FIG. 2B, to cause deflection of the exposure mask.

As described above, when the exposure mask 101 or the resist-coated substrate 102 is being electrically charged, even if the alignment operation for the exposure mask and the resist-coated substrate is completed while they are separated from each other (that is, before they are brought into close contact with each other), nevertheless, the exposure mask distortion will be caused by the electrostatic force in the middle of the approaching motion for closely contacting the mask and the substrate. If this occurs, the position of the exposure mask may deviate from the position where the mask has been aligned with the substrate, while being kept apart from the substrate.

Furthermore, distortion of the exposure mask causes distortion of the mask pattern, which interrupts accurate pattern exposure.

Additionally, if a mask is distorted by an electrostatic force, even though it occurs before carrying out the alignment process, the position of alignment marks of the exposure mask may deviate, which, in turn, interrupts the alignment operation itself.

Japanese Laid-Open Patent Application No. 2005-101133 shows a structure in which removal of the electrification is carried out only when an exposure mask and a resist-coated substrate are just going to be separated from each other. In other words, it is not a structure configured so that the removal of the electrification is carried out before the alignment operation to remove the electrification of the exposure mask and the resist-coated substrate.

Furthermore, in Japanese Laid-Open Patent Application No. 2000-321777, although soft X-rays are projected in a direction along the surface of the exposure mask and the resist-coated substrate to remove electrification of them, the removal of the electrification effect based on the soft X-rays decreases largely in the direction of irradiation.

Therefore, in order to complete the removal of the electrification throughout the whole surface, it is necessary to wait until the farthest point from the soft X-ray projector to have the electrification removed.

Furthermore, if the method disclosed in Japanese Laid-Open Patent Application No. 2000-321777, mentioned above, is applied to the exposure method described in U.S.

Pat. No. 6,171,730, wherein a thin-film mask is deflected and contacted to a substrate, there will be inconveniences, such as follows. Namely, if the soft X-rays are projected along the mask surface, there is a possibility that the thin-film mask being flexed blocks the radiation. If this occurs, it causes uneven removal of the electrification of the exposure mask and the resist-coated substrate.

DISCLOSURE OF THE INVENTION

The present invention, in an aspect thereof, provides a near-field exposure mask apparatus comprising a near-field exposure mask, a mechanism configured to place a substrate, to be exposed, opposed to the near-field exposure mask, a mechanism configured to perform relative alignment of the near-field exposure mask and the substrate to be exposed, a mechanism configured to closely contact the near-field exposure mask and the substrate to be exposed, with each other, a mechanism for projecting exposure light to the near-field exposure mask, and a soft X-ray irradiating device for removing static electricity charged in at least one of the near-field exposure mask and the substrate to be exposed, wherein the soft X-ray irradiating device is disposed at a side of the near-field exposure mask remote from the substrate to be exposed.

The present invention, in another aspect thereof, provides a near-field exposure method, in which a near-field exposure mask comprised of a mask base material and a light blocking film formed thereon and having an opening smaller than an exposure wavelength $\lambda$ (nm) is closely contacted to a substrate to be exposed, and in which light is projected from an exposure light irradiating mechanism, to form a pattern on the substrate to be exposed, the method comprising a step of projecting soft X-rays to the near-field exposure mask from a side of the near-field exposure mask remote from the substrate to be exposed, to remove static electricity charged in at least one of the near-field exposure mask and the substrate to be exposed, a step of closely contacting the near-field exposure mask and the substrate to be exposed, with each other, a step of projecting exposure light to the near-field exposure mask, and a step of separating the near-field exposure mask and the substrate to be exposed, from each other.

In accordance with the present invention, close-contact exposure based on near-field exposure can be accomplished, while assuring that any static electricity charged in a near-field exposure mask or a substrate to be exposed is removed. Hence, the alignment precision is improved significantly.

These and other objects, features and advantages of the present invention will become more apparent upon a consideration of the following description of the preferred embodiments of the present invention, taken in conjunction with the accompanying drawings.

BEST MODE FOR PRACTICING THE INVENTION

Now, one best mode for practicing the present invention will be explained.

Figure 5A:
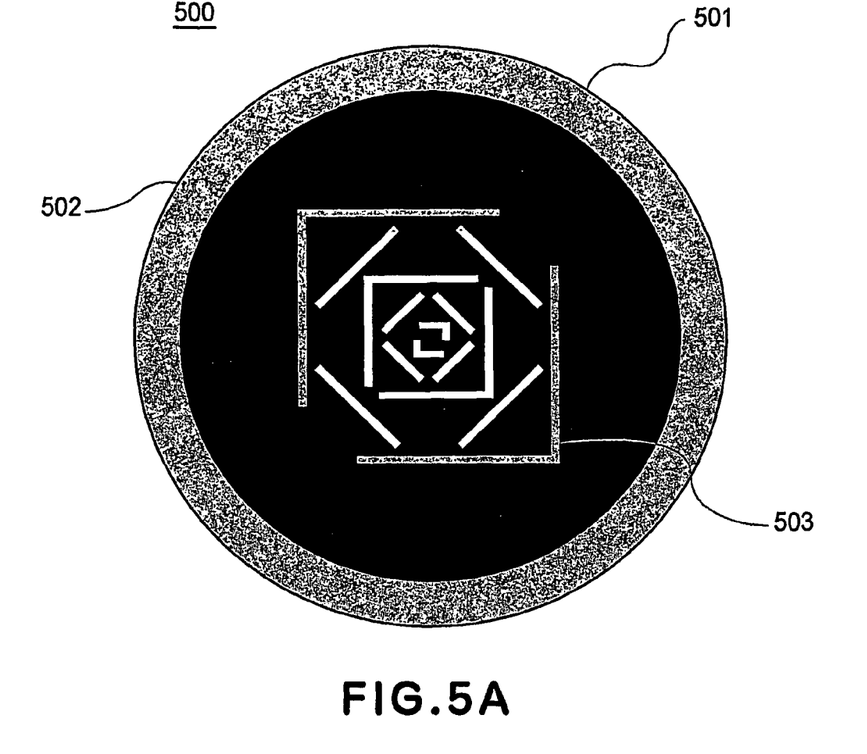
FIG. 5A and FIG. 5B are schematic diagrams for explaining a near-field exposure mask used in the embodiments of the present invention.
Figure 5B:
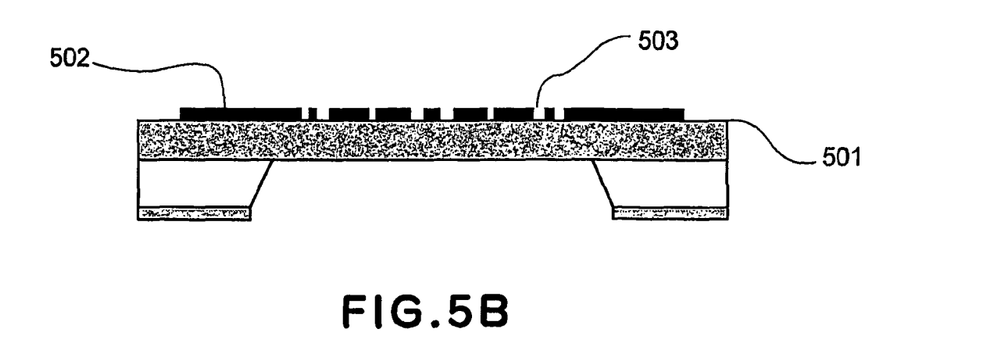

First of all, a near-field exposure mask usable in the present invention may be one schematically shown in FIG. 5A and FIG. 5B. This exposure mask is comprised of a mask base material 501 and a light blocking film layer 502, provided on the base material 501, and having openings (minute apertures) smaller than the exposure wavelength $\lambda$ (nm).

The mask base material 501 may be made of silicon nitride having a thickness in the range of 0.1 µm through 1.0 µm, or synthetic resin having a thickness not less than 1 µm, and not greater than 500 µm, for example.

Figure 1:
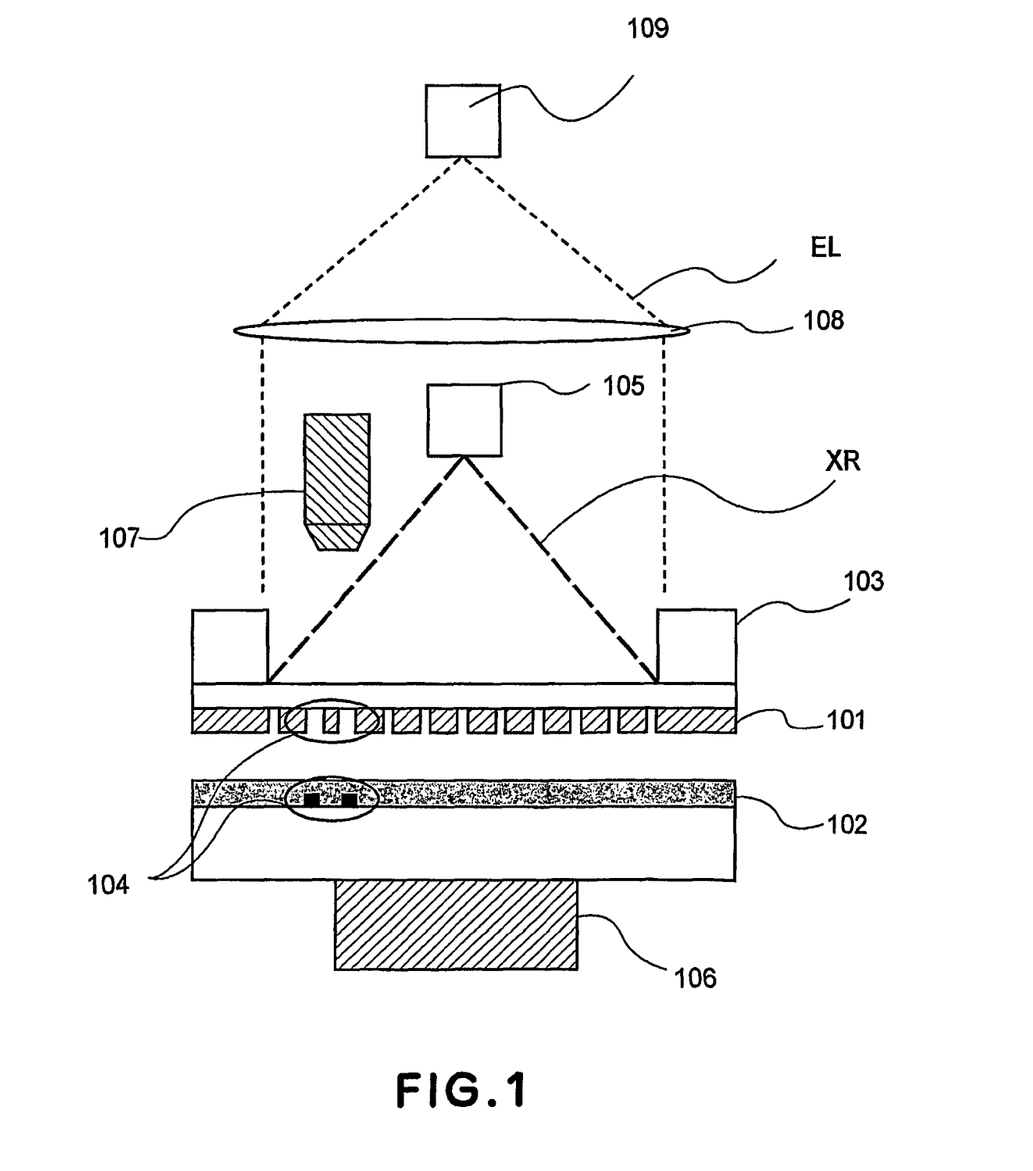
FIG. 1 is a schematic diagram of a structural example of a near-field exposure apparatus in accordance with one mode for embodying the present invention.

FIG. 1 shows a structural example of a near-field exposure apparatus, in this mode, for practicing the present invention.

First of all, an alignment process will be explained with reference to FIG. 1.

An exposure mask 101 with alignment marks 104 and a resist-coated substrate (workpiece to be exposed) 102 having alignment marks 104 corresponding to the alignment marks 104 of the mask are disposed (disposed opposed), so that the surface defined by a light blocking material of the exposure mask 101 and the resist surface side of the substrate 102, where the marks are formed, are opposed to each other.

Hereafter, the surface of the exposure mask 101 with the alignment marks, as defined by light blocking material, will be referred to as a "mask front face". Also, the resist side surface of the resist-coated substrate 102 will be referred to as a "substrate front face".

The exposure mask 101 described above is supported by a mask chuck mechanism 103. Here, the mask chuck mechanism 103 and a stage 106, on which the substrate 102 is placed, constitute a mechanism for disposing the substrate to be exposed, opposed to the near-field exposure mask.

A soft X-ray irradiating device 105 is mounted at an opposite side of the resist coated substrate 102 across the exposure mask 101. Namely, the soft X-ray irradiating device 105 is disposed at a side of the exposure mask 101 remote from the resist-coated substrate 102. Here, the soft X-ray irradiating device 105 is so disposed that it irradiates soft X-rays in a direction toward the exposure mask 101.

The soft X-rays irradiated by this soft X-ray device are electromagnetic waves having a wavelength of 0.1 nm to 1 nm. Air, or the like, when irradiated with soft X -rays is ionized, such that, by ions, any object being electrically charged can have the electrical charge removed.

The exposure mask to be used here may be any one, if it is comprised of a material and a thickness adapted to transmit the soft X-rays. For example, a mask of silicon light-blocking film, having a thickness of 50 nm formed on an SiN thin film of a thickness 500 nm, may be used, and about 80% transmittance is obtainable with that. Alternatively, a mask of silicon light-blocking film having a thickness of 100 nm formed on an optical plastic of a thickness of 500 µm may be used, and a transmittance of about 20% or more is obtainable with it.

After the exposure mask 101 and the resist-coated substrate 102 are disposed opposed to each other, soft X-rays XR are projected from the soft X-ray irradiation device 105. Here, the soft X-rays passed through the exposure mask 101 generate ions between the mask front face of the exposure mask 101 and the substrate front face of the resist-coated substrate 102, by which, any static electricity charged therein is removed.

Subsequently, the alignment marks 104 of the exposure mask 101 and the alignment marks 104 of the resist-coated substrate 102 are observed by use of an alignment optical system 107. Then, the stage 106 is driven to perform relative positioning of the mask and the substrate, so that they are placed in a predetermined relative positional relationship.

Thereafter, the exposure mask 101 and the resist-coated substrate 102 are brought into close contact with each other, and the irradiation of the soft X-rays is stopped. Then, by use of a soft X-ray irradiation device moving mechanism (not shown in the drawing), the soft X-ray irradiation device 105 is moved to a position not blocking the exposure light to be projected in the subsequent step. Namely, the soft X-ray irradiation device 105 is configured to be displaceable out of the light path of the light source 109, which is an exposure light irradiating mechanism.

Alternatively, the soft X-ray irradiation device may be mounted at a position not interfering with the illumination optical system 108 for projecting the exposure light or with the exposure light EL.

The exposure light EL from the exposure light source 109, to which the resist of the substrate has a photosensitivity, is projected onto the exposure mask 101, and, in response, near-field light is produced at the minute openings of the exposure mask 101. The photosensitive resist of the substrate is exposed with this near-field light.

After the exposure, the exposure mask 101 is separated from the resist-coated substrate 102. Here, the exposure mask 101 may be separated from the substrate 102, while the mask 101 and the substrate 102 are irradiated with the soft X-rays XR from the soft X-ray irradiation device 105, since there is a possibility that the exposure mask 101 is charged by electrification through the separation.

Alternatively, when the soft X-ray irradiation device is disposed at a position not interfering with the exposure light EL, as described above, the soft X-rays may be projected continuously during the process mentioned above.

After the separation, the resist-coated substrate 102 is moved by the stage 106 to the point where the resist-coated substrate 102 should be exposed subsequently. Then, while the soft X-rays XR are projected again to remove the electrification of the exposure mask 101 and the resist-coated substrate 102, the above-described procedure is repeated with respect to required points.

In accordance with the exposure method based on the near-field exposure apparatus of this mode of the present invention, the static electricity charged in between the exposure mask and the resist-coated substrate can be collectively removed, throughout the entire mask and substrate surfaces. Therefore, highest-precision alignment is assured.

Next, preferred embodiments of the present invention will be explained.

Embodiment 1

A first embodiment of the present invention will be described with reference to a near-field exposure apparatus and a near-field exposure method to which the present invention is applied.

Figure 3:
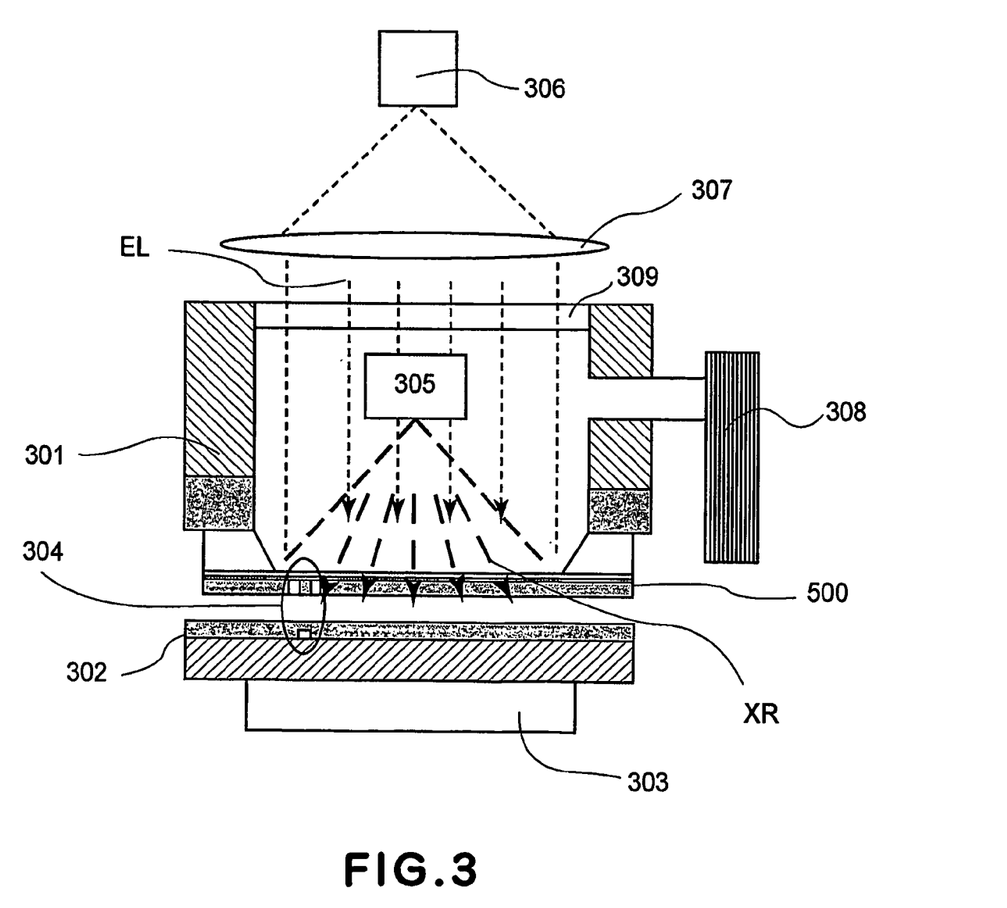
FIG. 3 is a schematic diagram of a near-field exposure apparatus used in a first embodiment of the present invention.

FIG. 3 is a schematic diagram of a near-field exposure apparatus used in the present embodiment.

First of all, referring to FIG. 5A and FIG. 5B, an exposure mask 500 of the near-field exposure apparatus used in the present embodiment will be explained.

The exposure mask 500 is comprised of an SiN material having a thickness of 500 nm as a base material 501, which is supported by a silicon substrate, and a film of amorphous silicon having a thickness of 50 nm formed on the base material, as a light blocking film layer 502. This light blocking film layer 502 has formed therein minute openings 503 having an opening width less than 100 nm, which is less than the wavelength of the exposure light used there. This mask has a soft X-ray transmittance of about 80%.

First, the exposure mask 500 is attached to a pressure-regulated container 301, so that the mask front face thereof faces outside the container 310 (facing downwardly in FIG. 3). Then, the substrate 302, with a positive type photosensitive photoresist having a sensitivity with respect to a wavelength of 365 nm, is attached to the stage 303, with the substrate front face thereof facing the exposure mask 500.

Subsequently, the stage 303 is driven so as to dispose the exposure mask 500 and the resist-coated substrate 302 in parallel to and opposed to each other, while keeping a spacing of 50 µm therebetween.

After this, soft X-rays XR are projected to the exposure mask 500 from the soft X-ray irradiation device 305, which is mounted above the exposure mask 500, as viewed in the drawing. By the soft X-rays XR passing through the mask 500, ions are generated between the exposure mask 500 and the resist-coated substrate 302, by which electrification is removed from both of them.

While the soft X-rays XR are irradiated, the relative alignment of the exposure mask and the resist-coated substrate is carried out by use of an alignment optical system (not illustrated), while observing alignment marks 304 formed on the exposure mask 500 and the resist-coated substrate.

Subsequently, the pressure-regulated container 301 is pressurized by means of a pressure regulating mechanism 308, so as to produce a pressure difference between the front face and the rear face of the exposure mask 500, to cause flexure of the exposure mask 500, thereby to bring the exposure mask 500 and the resist-coated substrate 302 into close contact with each other.

Here, if the precision of alignment between the exposure mask 500 and the resist-coated substrate 302 has deviated out of the tolerable range, the mask and the substrate may be once separated from each other and, again, they may be closely contacted to each other.

Then, the soft X-ray irradiation device 305 is moved by means of a driving mechanism (not illustrated), to a position not blocking the exposure light. Thereafter, the exposure mask 500 is irradiated with exposure light EL of i-line (wavelength 365 nm), being projected from a mercury-arc lamp, which is an exposure light source 306, through an illumination optical system 307. In response to this, near-field light is generated at the minute openings 503 formed in the exposure mask 500, and the resist-coated substrate 302 is exposed with this near-field light. As a result, a pattern (latent image) is produced in the resist, on the basis of the opening pattern formed on the exposure mask.

After this, the inside pressure of the pressure-regulated container 301 is turned back to the atmospheric pressure, and the exposure mask 500 and the resist-coated substrate 302 are separated from each other.

Then, the stage 303 moves the substrate 302 to a point to be exposed subsequently, and the processes described above are repeated. In this manner, exposure of the resist-coated substrate is carried out at plural points thereon.

With the alignment of the exposure mask and the resist-coated substrate, based on the structure and procedure described above, the highest-precision alignment can be done.

Embodiment 2

A second embodiment of the present invention will be explained, with reference to a near-field exposure apparatus and a near-field exposure method, different from the first embodiment of the present invention.

Figure 4:
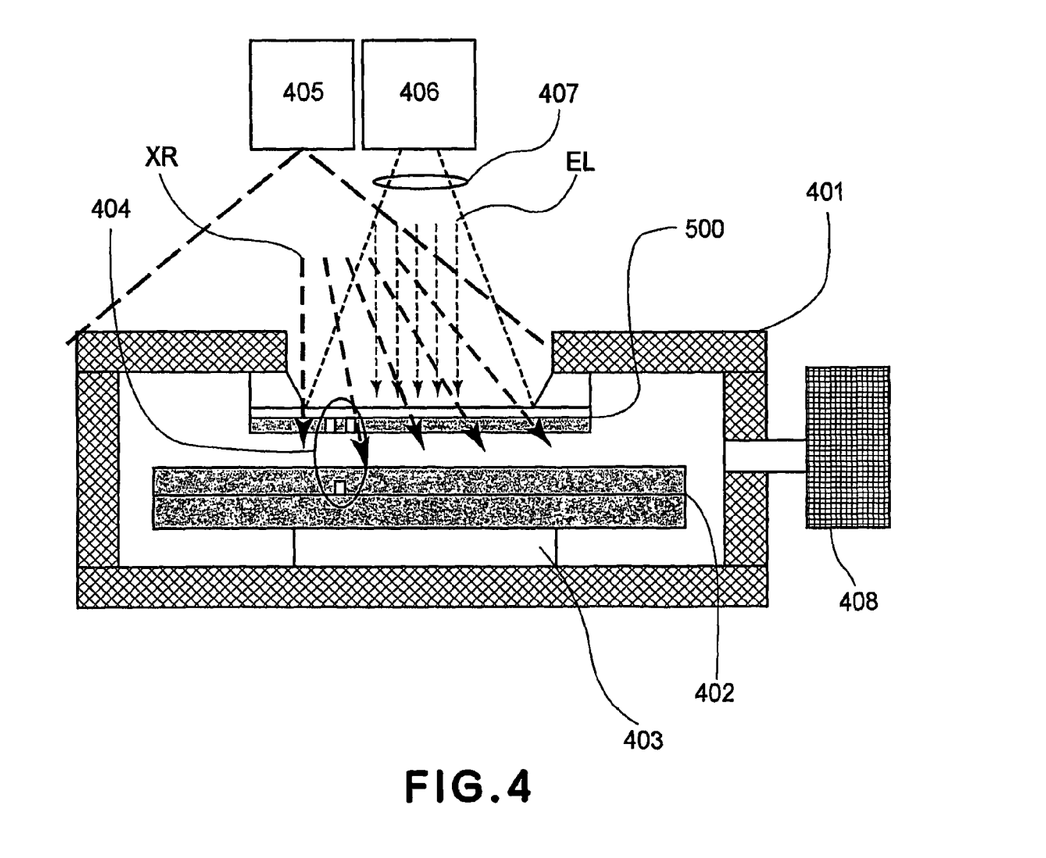
FIG. 4 is a schematic diagram of a near-field exposure apparatus used in a second embodiment of the present invention.

FIG. 4 is a schematic diagram of a near-field exposure apparatus used in the present embodiment.

First of all, referring to FIG. 5A and FIG. 5B, an exposure mask 500 of the near-field exposure apparatus used in the present embodiment will be explained.

The exposure mask 500 is comprised of a mask, which includes a mask base material 501 made of synthetic resin having a thickness of 500 nm, and a light blocking film layer 502 made of amorphous silicon having a thickness of 50 nm.

As regards the synthetic resin constituting the mask base material 501, a plastic film or sheet made of the following materials may be used.

For example, polyethylene, polypropylene, cyclic polyolefin, and polyolefin, such as polyvinylchloride, are usable.

Alternatively, polyethylene terephthalate, polybutylene terephthalate, polyester resin, such as polyethylene naphthalates, acryl resin, such as polymethyl methacrylic acid, polystyrene polycarbonate, and polyimide, are usable.

From the viewpoint of transparency, heat resistance and chemical resistance, cyclic polyolefin, polyethylene terephthalate, a polycarbonate, and polymethyl methacrylic acid may preferably be used.

More specifically, "ARTON", available from JSR Co., and "ZEONORR" and "ZEONEXR", available from Nippon Zeon Co. (these are cyclic polyolefins), or "Lumirror R", available from Toray Industries, Inc., for example, may preferably be used.

Alternatively, "Tetoron R" (polyethylene terephthalate), available from Teijin DuPont Film Japan, Ltd., or "Panlite" (polycarbonate), available from Teijin Chemicals, Ltd., may preferably be used.

If any one of these materials is used as the mask base material having a thickness of 500 µm, a transmittance of approximately 20%, or more, will be obtainable.

First, the exposure mask 500 is attached to a pressure-regulated container 401, so that the mask front face thereof faces inside the container 401. Then, a substrate 402 with a positive type photosensitive photoresist, having a sensitivity with respect to a wavelength of 365 nm, is attached to the stage 403, disposed inside the pressure-regulating container, with the substrate front face thereof facing the exposure mask 500.

Subsequently, the stage 403 is driven, so as to dispose the exposure mask 500 and the resist-coated substrate 402 parallel to and opposed to each other, while keeping a spacing of 50 µm therebetween.

After this, soft X-rays XR are projected to the exposure mask 500 from a soft X-ray irradiation device 405, which is mounted above the exposure mask 500, as viewed in the drawing. By the soft X-rays XR passing through the exposure mask 500, ions are generated between the exposure mask 500 and the resist-coated substrate 402, by which electrification is removed from both of them.

While the soft X-rays XR are irradiated, the relative alignment of the exposure mask and the resist-coated substrate 402 is carried out by use of an alignment optical system (not illustrated), while observing alignment marks 404 formed on the exposure mask 500 and the resist-coated substrate 402.

Subsequently, the pressure-regulated container 301 is depressurized by means of a pressure regulating mechanism 408, so as to produce a pressure difference between the front face and the rear face of the exposure mask 500, to cause flexure of the exposure mask 500, thereby, to bring the exposure mask 500 and the resist-coated substrate 302 into close contact with each other.

After this, as in the first embodiment, the exposure and separation are carried out, and irradiation of the soft X-rays XR is stopped. Subsequently, the stage is moved to repeatedly perform the exposure and alignment.

In the present embodiment, the soft X-ray irradiation may be carried out only between the alignment and the separation. This enables efficient operation of the soft X-ray irradiation device.

Here, as shown in FIG. 4, the soft X-ray irradiation device 405 and the exposure light source 406 may be disposed in series, in parallel to the exposure mask 500, so as not to interfere with the exposure light EL. This enhances the throughput. Namely, since the step of moving the soft X-ray irradiation device in the exposure process becomes unnecessary, the throughput of a series of exposure operations can be improved.

While the invention has been described with reference to the structures disclosed herein, it is not confined to the details set forth, and this application is intended to cover such modifications, or changes as may come within the purposes of the improvements or the scope of the following claims.

The invention claimed is:

1. A near-field exposure apparatus comprising:
a near-field exposure mask;
a mechanism configured to place a substrate, to be exposed, opposed to the near-field exposure mask;
a mechanism configured to perform relative alignment of the near-field exposure mask and the substrate to be exposed;
a mechanism configured to closely contact the near-field exposure mask and the substrate to be exposed, with each other;
a mechanism configured to project exposure light to the near-field exposure mask; and
a soft X-ray irradiating device configured to remove static electricity charged in at least one of the near-field exposure mask and the substrate to be exposed, wherein said soft X-ray irradiating device is disposed such that the near-field exposure mask is located between said soft X-ray irradiating device and the substrate to be exposed.

2. A near-field exposure apparatus according to claim 1, further comprising a mechanism configured to move said soft X-ray irradiating device, wherein said soft X-ray irradiating device moving mechanism is arranged to displace said soft X-ray irradiating device out of a light path of the exposure light projected from said exposure light projecting mechanism.

3. A near-field exposure apparatus according to claim 1, wherein the near-field exposure mask is comprised of (i) a mask base material through which the exposure light can be transmitted and (ii) a light blocking film provided on the mask base material and having an opening smaller than an exposure wavelength λ (nm), and wherein the near-field exposure mask is configured to transmit the soft X-rays.

4. A near-field exposure apparatus according to claim 3, wherein the mask base material is made of silicon nitride having a thickness in a range from 0.1 µm through 1.0 µm.

5. A near-field exposure apparatus according to claim 3, wherein the mask base material is made of a synthetic resin having a thickness not less than 1 λm and not greater than 500 µm.

6. A near-field exposure apparatus according to claim 2, wherein the near-field exposure mask is comprised of (i) a mask base material through which the exposure light can be transmitted and (ii) a light blocking film provided on the mask base material and having an opening smaller than an exposure wavelength λ (nm), and wherein the near-field exposure mask is configured to transmit the soft X-rays.

7. A near-field exposure apparatus according to claim 6, wherein the mask base material is made of silicon nitride having a thickness in a range from 0.1 µm through 1.0 µm.

8. A near-field exposure apparatus according to claim 6, wherein the mask base material is made of a synthetic resin having a thickness not less than 1 µm and not greater than 500 µm.

9. A near-field exposure method in which a near-field exposure mask, comprised of a mask base material and a light blocking film formed thereon and having an opening smaller than an exposure wavelength λ (nm), is closely contacted to a substrate to be exposed, and in which light is projected from an exposure light irradiating mechanism to form a pattern on the substrate to be exposed, said method comprising:

a step of projecting soft X-rays, using a soft X-ray irradiating device, to the near-field exposure mask to remove static electricity charged in at least one of the near-field exposure mask and the substrate to be exposed, wherein the soft X-ray irradiating device is disposed such that the near-field exposure mask is located between the soft X-ray irradiating device and the substrate to be exposed;

a step of performing relative alignment of the near-field exposure mask and the substrate to be exposed;

a step of closely contacting the near-field exposure mask and the substrate to be exposed, with each other;

a step of projecting exposure light to the near-field exposure mask; and a step of separating the near-field exposure mask and the substrate to be exposed, from each other.

10. A method according to claim 9, wherein said soft X-ray projecting step is carried out between said relative alignment performing step, said closely contacting step and said separating step.

* * * * *